United States Patent [19]

Schachameyer et al.

[11] Patent Number: 4,670,063

[45] Date of Patent: Jun. 2, 1987

[54] SEMICONDUCTOR PROCESSING TECHNIQUE WITH DIFFERENTIALLY FLUXED RADIATION AT INCREMENTAL THICKNESSES

[75] Inventors: Steven R. Schachameyer, Whitefish Bay; James A. Benjamin, Waukesha; John B. Pardee, Milwaukee, all of Wis.; Lyle O. Hoppie, Birmingham, Mich.

[73] Assignee: Eaton Corporation, Cleveland, Ohio

[21] Appl. No.: 721,553

[22] Filed: Apr. 10, 1985

[51] Int. Cl.$^4$ .................. H01L 21/265; B05D 5/12
[52] U.S. Cl. .................. 148/1.5; 29/576 B; 29/576 T; 148/175; 148/187; 148/DIG. 93; 156/635; 156/643; 427/53.1
[58] Field of Search .......... 148/1.5, 175, 187; 29/576 B, 576 T; 427/53.1; 156/635, 643

[56] References Cited

U.S. PATENT DOCUMENTS

| 4,370,176 | 1/1983 | Bruel ..................... 148/1.5 |
| 4,394,237 | 7/1983 | Donnelly et al. ........... 204/192 R |
| 4,529,617 | 7/1985 | Chenevas-Paule et al. ..... 427/53.1 |

OTHER PUBLICATIONS

Deutsch in Mat. Res. Soc. Symp. #17, ed. Osgood et al., Elseviy, 1983, p. 225.
Young et al., Solid St. Technol. 26, (1983), p. 183.
Ehrlich et al., IEEE J. Quantum Electronics, QE—16, (1980), 1233.
Bäuerle, D. in Laser—Photochemical Processing—Dences, ed. Osgood et al., North Holland, N.Y., 1982, p. 19.
Eden et al., Ibid, p. 185.

Primary Examiner—Upendra Roy
Attorney, Agent, or Firm—Andrus, Sceales, Starke & Sawall

[57] ABSTRACT

A semiconductor processing technique is disclosed for periodically selectively effecting lattice ordering and dopant distribution during a semiconductor layer formation process. Excimer pulsed ultraviolet laser radiation is provided at different energy fluxes to provide an electrically active layer as formed, without post-annealing, and curing lattice damage otherwise due to certain processing methods such as ion implantation. In a photolytic deposition technique, excimer laser radiation is periodically increased to transiently provide a pyrolytic thermal reaction in the layer as thus far deposited to provide a plurality of short intermittent periodic annealing steps to ensure crystallization as the layer continues to be deposited at lower radiation energy fluxes. Single crystalline material may be formed without post-annealing by periodically irradiating incremental thicknesses of the layer as formed.

2 Claims, 4 Drawing Figures

SEMICONDUCTOR PROCESSING TECHNIQUE WITH DIFFERENTIALLY FLUXED RADIATION AT INCREMENTAL THICKNESSES

BACKGROUND AND SUMMARY

The invention provides a semiconductor processing technique for periodically selectively effecting lattice ordering and dopant distribution during a semiconductor layer formation process.

In many semiconductor processing operations, particularly those which damage the lattice, such as ion implantation, it is necessary to provide an additional post-annealing step to recrystallize the formed semiconductor layer or otherwise provide desirable electrical characteristics. This extra step may be cost objectionable. Furthermore, the thicker the layer, the more difficult it is to provide a post-annealing step for restoring desirable electrical characteristics because the product of time and temperature increases with increasing thickness.

The present invention provides a simple and effective solution to the above noted and other problems.

DETAILED DESCRIPTION

Figure 1:
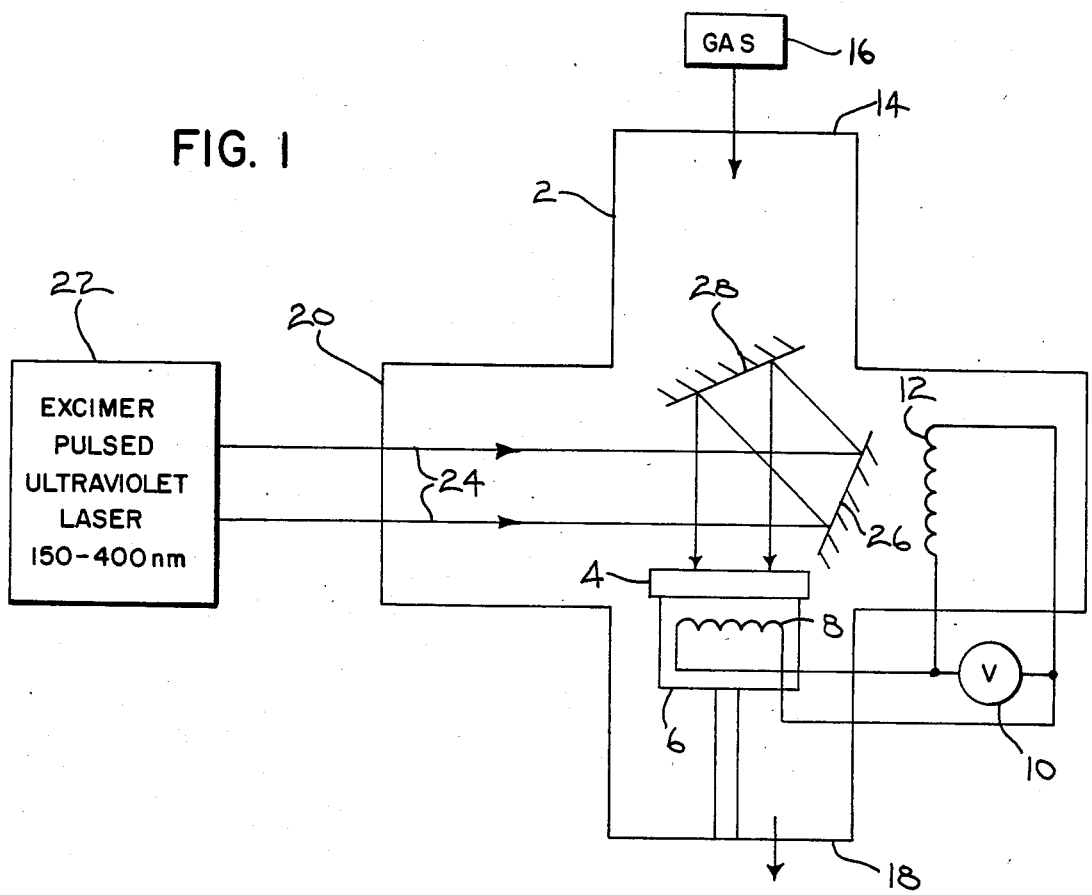
FIG. 1 schematically illustrates a semiconductor processing technique in accordance with the invention.

FIG. 1 illustrates a semiconductor processing technique for periodically selectively effecting lattice ordering and dopant distribution during a semiconductor layer formation process. Excimer pulsed ultraviolet laser radiation is provided at different energy fluxes to provide an electrically active semiconductor layer as formed, without post-annealing.

A conventional processing chamber 2 is provided, and a semiconductor wafer substrate 4 is placed therein on a suporting pedestal 6 which typically has a resistance heating coil 8 or the like driven by a voltage source 10 for heating the substrate and/or a resistance heating coil 12 for heating the interior of chamber 2, as is conventional. Reactant gas may be introduced into chamber 2 at port 14 from gas supply 16 and may be exhausted at port 18, as is conventional. Chamber 2 typically includes an observation window or port 20. Excimer pulsed ultraviolet laser radiation from laser 22 is introduced into chamber 2 at 24 through port 20, and may be directed by mirrors 26 and 28 to impinge wafer substrate 4.

Processing chamber 2 may be used to carry out a variety of processing techniques, such as chemical vapor deposition, molecular beam epitaxy, ion implantation, metallo-organic chemical vapor deposition, and so on. These types of thermal processes are carried out at an elevated temperature such as 1,000° C. and thermally drive a pyrolytic reaction with the gas in the chamber to thermally activate and vibrationally break chemical bonds of the gas molecules to cause a reaction such as deposition, diffusion and so on. The excimer pulsed ultraviolet laser radiation from laser 22 provides an additional separate nonthermal energy source aiding the reaction by photochemically breaking bonds. The excimer pulsed ultraviolet laser radiation is provided at a discrete designated pulsed wavelength corresponding to a discrete excitation energy of the reactant or dopant gas photochemically breaking bonds of such gas such that the gas is photolytically activated, in addition to the noted thermal activation.

Figure 3:
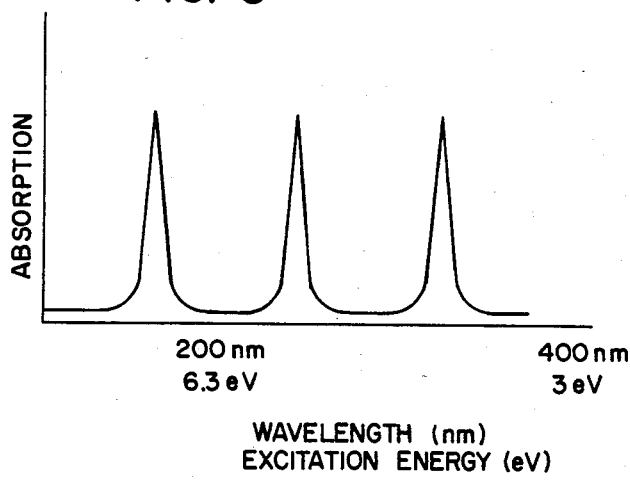
FIG. 3 shows a gas absorption spectrum.
Figure 2:
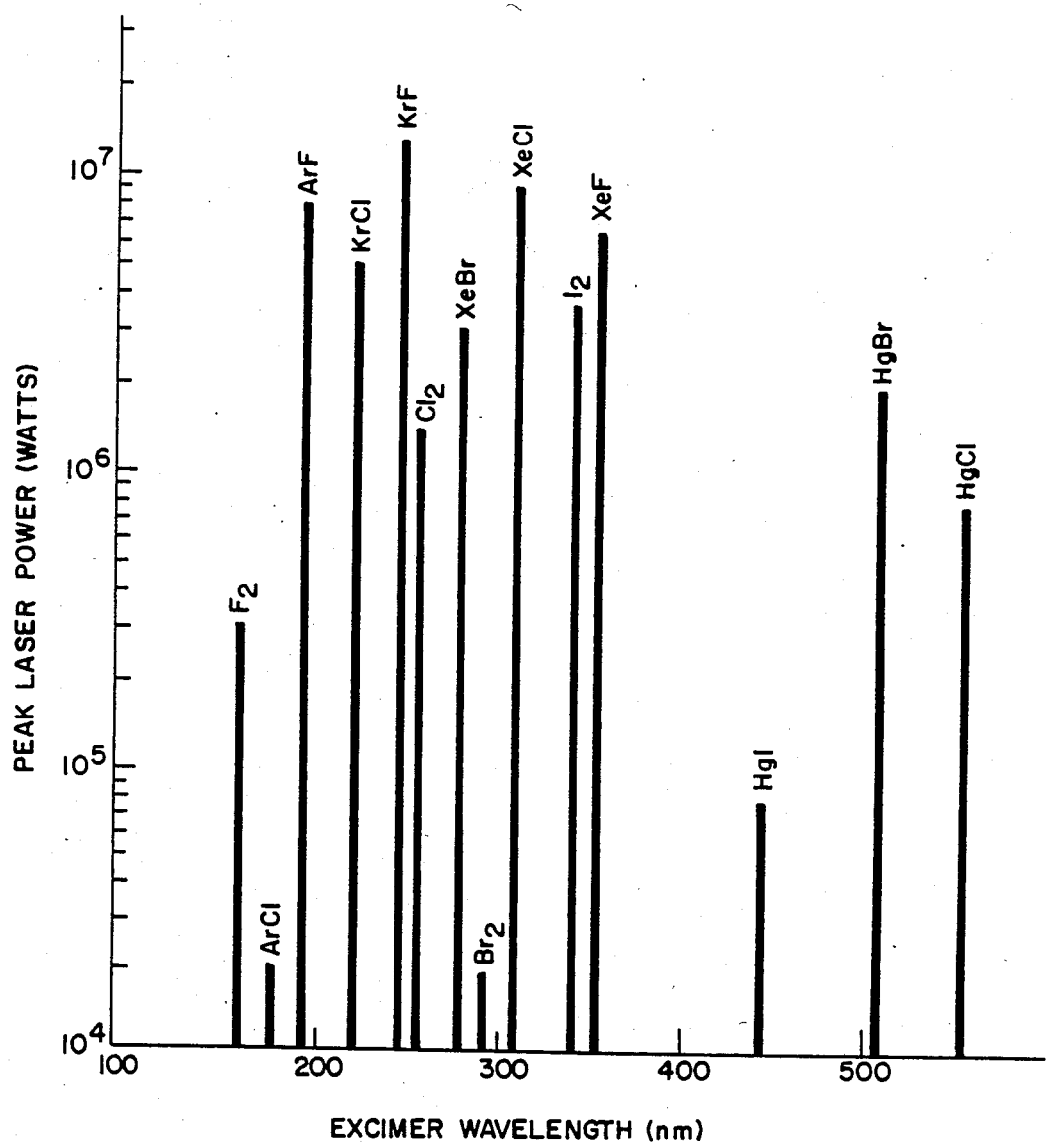
FIG. 2 shows available excimer pulsed ultraviolet laser radiation wavelengths and peak power.

FIG. 2 shows various available excimer pulsed ultraviolet laser radiation wavelength and peak power. FIG. 3 shows an absorption spectrum for a reactant or dopant gas with absorption peaks at discrete designated excitation energy wavelengths. The excimer pulsed ultraviolet radiation wavelength is chosen according to the reactant or dopant gas, or vice versa. The narrow spectral output of the excimer pulsed laser provides highly specific electronic excitation of reactants and dopants, allowing selective breaking of a particular molecule's bonds driving a predetermined controllable reaction, aiding and enhancing the noted conventional processing technique in chamber 2. The excimer pulsed laser photolytic reaction is provided at a radiation energy flux of about 0.1 joule per square centimeter, and is itself nonthermal and photolytic in nature, as opposed to a thermally driven pyrolytic reaction at elevated temperatures thermally vibrationally breaking gas molecule bonds.

Various of the noted conventional semiconductor layer formation processes damage the lattice upon which the layer is formed, especially ion implantation. In the present invention, it is particularly simple and efficient to merely provide a different radiation energy flux from the excimer pulsed laser to redistribute dopant or ions within the lattice. For example, the energy flux may be increased to about 0.3 joule per square centimeter to provide such redistribution.

In an alternative, the conventional processing may be omitted, and the excimer pulsed ultraviolet laser radiation from laser means 22 may be provided at a discrete wavelength to photolytically react with gas in chamber 2 from source 16 at a discrete excitation energy photochemically breaking bonds of the gas to epitaxially deposit a semiconductor layer on wafer substrate 4, without thermally driven pyrolytic deposition. During this excimer laser radiation deposition, the laser means power may be periodically increased to increase laser radiation energy flux to periodically and transiently provide a pyrolytic thermal reaction in the layer as thus far deposited to provide a plurality of short intermittent periodic annealing or flash melting crystallization steps to ensure crystallization to single crystalline semiconductor material as the layer continues to be deposited at the lower radiation energy fluxes, for example 0.1 joule per square centimeter. The deposition of the semiconductor layer is thus carried out by excimer laser radiation energy flux of about 0.1 joule per square centimeter. The energy flux is periodically transiently intermittently increased to about 0.3 joule per square centimeter to provide a short intermittent annealing step during deposition.

Figure 4:
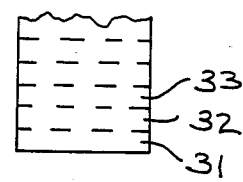
FIG. 4 schematically illustrates a periodically irradiated incremental processing technique in accordance with the invention.

FIG. 4 illustrates, in a semiconductor process for forming a semiconductor layer on a substrate, a technique for providing a single crystalline layer without post-annealing. Laser means periodically irradiates incremental thicknesses of the layer with laser radiation pulses as the layer is formed. This method involves crystallizing a first increment 31 of the layer thickness with a burst of laser radiation, and then waiting for a second increment 32 to be formed over first increment 31 and then crystallizing second increment 32 with another burst of laser radiation, and then waiting for a third increment 33 of the semiconductor layer to be formed over second increment 32 and then crystallizing third layer 33 with another burst of laser radiation, and so on. For example, if a 1,000 angstrom thickness layer is to be formed, the laser radiation energy flux may be increased to 0.3 joule per square centimeter periodically at every 100 angstrom increment in thickness during the formation process to ensure single crystalline material. This is particularly simple and efficient by merely periodically increasing the excimer pulsed laser output energy flux. In contrast, a traditional thermal process does not enable such precise control nor activation at designated thicknesses with any accuracy. Furthermore, the incremental step-by-step process of the invention provides significantly higher reliability in ensuring single crystalline and electrically active material, as opposed to post-annealing a cumulatively thick layer which may require a substantial product of time and temperature. Thermal processes are not amenable to the small increment step-by-step crystallization approach of the invention.

It is recognized that various alternatives and modifications are possible within the scope of the appended claims.

We claim:

1. A semiconductor processing technique for depositing a semiconductor layer on a substrate and providing a desirable electrically active said layer without post-annealing, comprising:
   providing a processing chamber;
   placing a semiconductor wafer substrate in said chamber;
   introducing a gas into said chamber;
   providing excimer pulsed ultraviolet laser means and introducing radiation therefrom into said chamber at a discrete wavelength to photolytically react with said gas at a discrete excitation energy photochemically breaking bonds of said gas to epitaxially deposit a semiconductor layer on said substrate, without thermally driven pyrolytic deposition; and
   during said excimer laser radiation deposition, periodically increasing laser means power to increase laser radiation energy flux to periodically and transiently provide a pyrolytic thermal reaction in said layer as thus far deposited to provide a plurality of short intermittent periodic annealing steps to ensure crystallization to single crystalline semiconductor material as said layer continues to be deposited at the lower radiation energy fluxes.

2. The invention according to claim 1 comprising depositing said semiconductor layer at excimer laser radiation energy flux of about 0.1 joule per square centimeter, and periodically transiently intermittently increasing said energy flux to about 0.3 joule per square centimeter to provide said short intermittent annealing steps during deposition.

* * * * *